United States Patent [19]

Pollachek

[11] Patent Number: 4,594,518

[45] Date of Patent: Jun. 10, 1986

[54] VOLTAGE LEVEL SENSING CIRCUIT

[75] Inventor: Robert G. Pollachek, Vancouver, Wash.

[73] Assignee: RCA Corporation, Princeton, N.J.

[21] Appl. No.: 628,302

[22] Filed: Jul. 6, 1984

[51] Int. Cl.⁴ ............................................. H03K 5/153
[52] U.S. Cl. ................................. 307/350; 307/296 R; 307/363
[58] Field of Search .................. 307/350, 296 R, 297, 307/363, 362

[56] References Cited

U.S. PATENT DOCUMENTS 4,001,609  1/1977  Sickert ........................... 307/296 R
4,300,065  11/1981  Remedi et al. ................... 307/296 R
4,409,501  10/1983  Eickerman et al. ............. 307/296 R Primary Examiner—John Zazworsky
Attorney, Agent, or Firm—Joseph S. Tripoli; George E. Haas; Henry I. Schanzer

[57] ABSTRACT

A first insulated-gate field-effect transistor (IGFET), responsive to an input voltage, supplies a current to a second IGFET when the input voltage exceeds the threshold voltage of the first IGFET. The second IGFET is connected in combination with a third IGFET, of complementary conductivity type, for sensing when the input voltage exceeds the sum of the threshold voltages of the second and third IGFETs. When that occurs, the third IGFET produces an output which is fed back to the first IGFET interrupting the flow of current between the first and second IGFETs.

10 Claims, 3 Drawing Figures

VOLTAGE LEVEL SENSING CIRCUIT

This invention relates to threshold detection circuits.

Threshold detection circuits are necessary in numerous analog and digital applications to determine whether and/or when a signal or voltage exceeds a particular level. For example, when power (i.e. the operating potential) is first being applied (being "ramped-up") to a memory system, many changes may occur on the address lines. In many read-only memories (ROMs) and random access memories (RAMs) employing transition detectors, changes on the address lines are used to trigger precharge and read-out cycles. As a result, erroneous data will be selected to be read-out and power will be wasted if the changes produced on the address lines while power is being applied are not inhibited or discounted. Also, when an operating voltage is first applied to a memory circuit, many of the storage elements may assume an undesirable state. Still further, information written into or read out of a memory is unreliable when the operating potential is below some minimum threshold level. It is therefore necessary to sense when power is being applied and reaches some minimum (threshold) level at which operation becomes reliable and/or desirable.

Known methods for sensing the application and/or presence of an operating voltage make use of the threshold voltage ($V_T$) of insulated-gate field-effect transistors (IGFETs). The threshold voltage of an enhancement IGFET is defined as the gate-to-source voltage ($V_{GS}$) which must be applied to initiate conduction in the source-to-drain path of the IGFET. In the discussion to follow, the threshold voltage ($V_T$) of P-type enhancement IGFETs is identified as $V_{TP}$ and the $V_T$ of N-type enhancement IGFETs as $V_{TN}$. For an N-type IGFET, its gate has to be at least $V_{TN}$ volts more positive than its source to initiate conduction. For a P-type IGFET, its gate has to be at least $V_{TP}$ volts more negative than its source.

However, known threshold detection and/or sensing circuits suffer from one or more disadvantages. For example, U.S. Pat. No. 3,809,926 to Alexander W. Young, entitled "Window Detector Circuit" has many useful features. However, the threshold level of the Young circuit is determined by the sum of the threshold voltages of two IGFETs of the same conductivity type. In many circuits, particularly in circuits employing IGFETs of complementary conductivity type (e.g. CMOS circuits), proper and reliable operation of the circuitry is assured only when the operating potential is equal to or exceeds the sum of the threshold voltages of a P-type and an N-type IGFET; that is, when the operating potential exceeds $V_{TP}$ plus $V_{TN}$. It is therefore desirable that for CMOS type circuits the threshold level be determined by summing the $V_T$ of a P-type and an N-type IGFET.

Threshold circuits employing the $V_T$ of complementary (i.e. P-type and N-type) IGFETs are shown, for example, in U.S. Pat. No. 3,628,070 to Heuner, et al. entitled "Voltage Reference and Voltage Level Sensing Circuit" and U.S. Pat. No. 4,385,245 issued to R. W. Ulmer entitled "MOS Power-On Reset Circuit". However, in both of these references the power dissipation of the circuit increases as the operating voltage is increased and there is a constant and relatively high steady state power dissipation. The steady state power dissipation in these circuits is a significant drawback since one of the main and most important features of complementary (e.g. CMOS) circuits is their low power dissipation. It is desirable and/or necessary to have a threshold detector or sense circuit whose power dissipation is low in keeping with the requirement of circuits employing transistors of complementary conductivity type.

Accordingly, in circuits embodying the invention, means are provided to reduce the power dissipation of the sense circuit once the desired threshold level is reached.

A circuit embodying the invention includes first and second threshold circuits. The first threshold circuit is responsive to an input voltage of greater amplitude than a first level for then coupling the input voltage to its output terminal. The second threshold circuit includes a first means coupled to the output terminal of the first threshold circuit for limiting the voltage at its output terminal to a first value, and a second means responsive to the input voltage being greater than the first value by a second value for producing at the output terminal of the second threshold circuit an output voltage corresponding to the input voltage when the amplitude of the input voltage exceeds the sum of the first and second values. The output of the second threshold circuit is fed back to the first threshold circuit for interrupting current flow to the output of the first threshold circuit when the second threshold circuit produces an output voltage corresponding to the input voltage.

In the accompanying drawing, like reference characters denote like components; and FIG. 1 is a schematic diagram of a voltage level sensing circuit embodying the invention;

Figure 1:
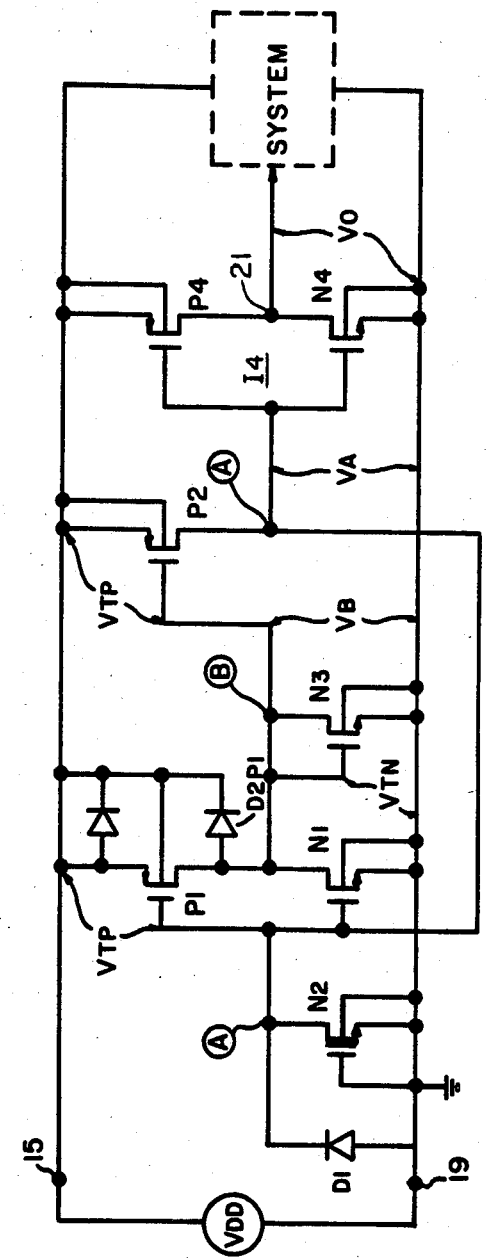

Insulated-gate field-effect transistors (IGFETs) are used in the circuit of FIG. 1. However, it is to be understood that other known types of transistors may be used to practice the invention. Characteristics of IGFETS pertinent to the better understanding of the operation of the circuit are presented below.

1. IGFETs have first and second electrodes, referred to as the source and drain, defining the ends of a conduction path, and a control electrode (gate) whose applied potential determines the conductivity of the conduction path. For a P-type IGFET, the source electrode is defined as that electrode of the first and second electrodes having the higher operating potential applied thereto. For an N-type IGFET, the source electrode is defined as that electrode of the first and second electrodes having the lower operating potential applied thereto.

2. IGFETs are bidirectional in the sense that when an enabling signal is applied to the control electrode, current can flow in either direction in the conduction path defined by the first and second electrodes.

3. For conduction to occur in an enhancement-mode IGFET, the applied gate-to-source potential ($V_{GS}$) must be in a direction to enhance conduction and must be greater in amplitude than a minimum value which is defined as the threshold voltage ($V_T$) of the IGFET. Thus, where the applied $V_{GS}$ is in a direction to enhance conduction but is lower in amplitude than $V_T$, the transistor remains cut off and there is substantially no current flow in the conduction channel.

Referring to the circuit of FIG. 1, the operating potential ($V_{DD}$) of the system is applied across terminals 15 and 19. Terminal 19 is returned to ground while the $V_{DD}$ voltage which is positive with respect to ground is applied to terminal 15.

The source electrodes of P-type enhancement IGFETs P1 and P2 are connected to terminal 15. The drain of P1 is connected to node B to which is also connected the gate electrode of P2. The drain of P2 is connected to node A to which is also connected the gate electrode of P1. The "parasitic" drain-to-substrate diode, D2P1, of P1 is expressly shown for reasons discussed below.

The cathode of a diode D1 is connected to node A and its anode to terminal 19. As poled, D1 blocks the flow of conventional current but passes leakage currents from node A to ground. Diode D1 is a PN junction whose junction area is made much larger than the drain-to-substrate junction of P2 to ensure that the leakage through D1 exceeds any leakage through P2. Diode D1 also functions as a capacitor whose capacitance is a function of the junction area. The leakage and capacitive features of D1 tend to cause node A to be discharged towards ground potential when P2 is non-conducting and when an operating potential is first applied between terminals 15 and 19. In addition to D1, the drain electrode of a depletion transistor N2 of N-conductivity type is connected to node A and its source and gate electrodes are returned to ground. N2 is a relatively high impedance device, which ensures that any leakage current flowing into node A is discharged to ground. Thus, D1 and N2 ensure that, in the absence of an operating potential ($V_{DD}$) or when $V_{DD}$ is small, the potential ($V_A$) at node A is at, or close to, ground potential.

The conduction paths of N-type enhancement IGFETS N1 and N3 are connected between node B and ground. The gate of N1 is connected to node A, whereby N1 and P1 form a complementary inverter. The gate electrode of N3 is connected to node B, whereby N3 functions as an "MOS diode" connected between node B and ground. N3 functions to limit the voltage developed at node B as further detailed below.

The output ($V_A$) produced at node A is applied to a complementary inverter I4 comprised of complementary conductivity type IGFETs P4 and N4. The gates of P4 and N4 are connected to node A, the sources of P4 and N4 are connected to terminal 15 and 19, respectively, and the drains of P4 and N4 are connected in common to output terminal 21 at which is produced the output voltage (Vo).

Figure 2:
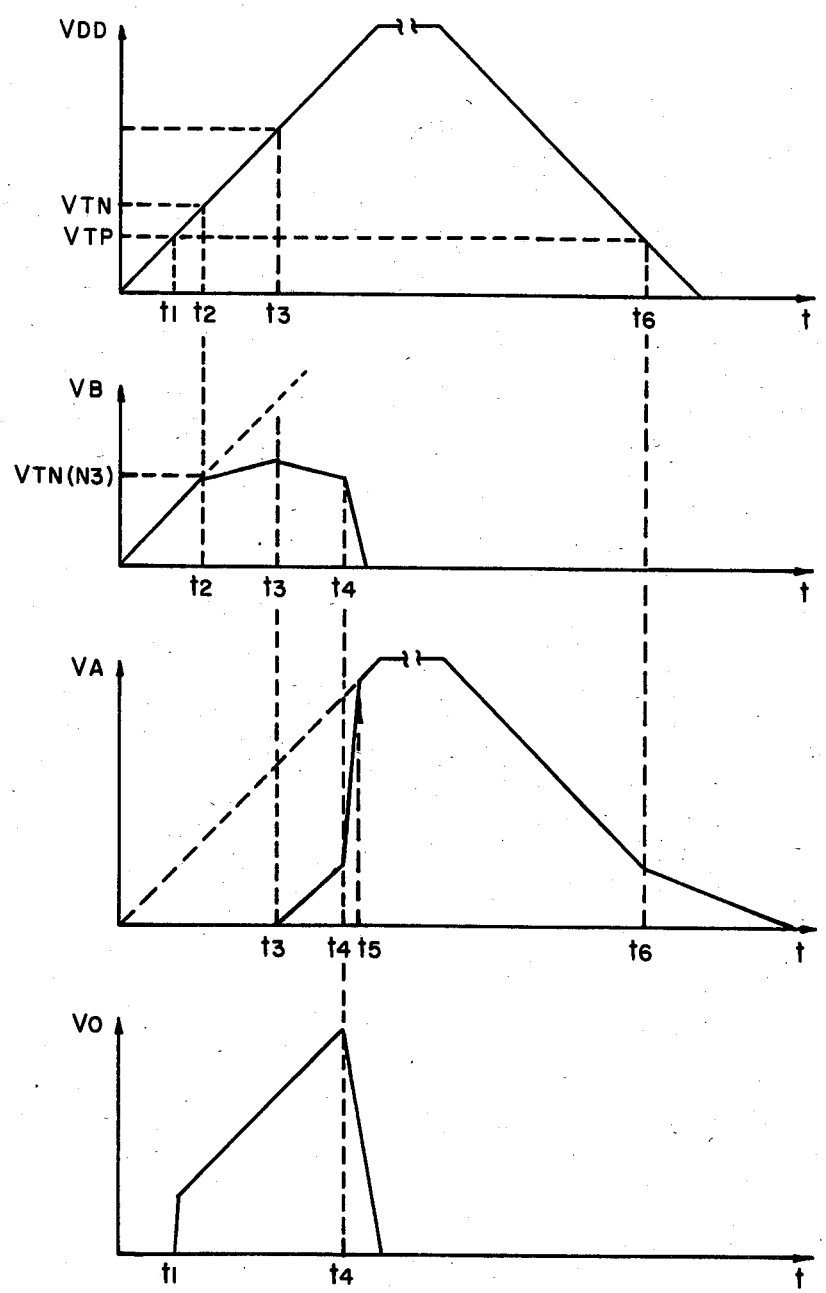
FIG. 2 is a diagram of waveforms associated with the circuit of FIG. 1.

In the discussion of the operation to follow, assume that $V_{DD}$ is initially zero volts and that it then increases (as shown in FIG. 2) towards a final value of approximately 5 volts.

As $V_{DD}$ increases from zero volts, a value of voltage is reached when $V_{DD}$ exceeds the threshold voltage ($V_{TP}$) of P1. By way of example, assume $V_{TP}$ to be equal to one volt and $V_{TN}$ to be equal to 1.5 volts. When $V_{DD}$ reaches $V_{TP}$, as shown at time $t_1$ in FIG. 2, P1 is turned on since the source of P1 is at $V_{TP}$ volts while the gate of P1 is at zero volts due to conduction via diode D1 or depletion transistor N2. Leakage current flowing from terminal 15 via parasitic diode D2P1 as well as displacement current through the junction capacitance of D2P1 cause the voltage ($V_B$) at node B to follow $V_{DD}$. Hence, $V_B$ is, initially, higher than the voltage ($V_A$) at node A, whereby P1 turns-on prior to P2. It is a feature of this circuit that P1 turns-on prior to P2 regardless of the speed with which $V_{DD}$ ramps up. This ensures that the threshold level of the circuit is the sum of the threshold voltages of P2 and N3, as further detailed below.

When $V_{DD}$ reaches $V_{TP}$ volts, P1 turns-on and couples $V_{DD}$ to node B via its conduction path. Until N3 (or N1) begins to conduct the voltage ($V_B$) at node B follows the rise in $V_{DD}$ as shown in FIG. 2. Since $V_{DD}$ volts is applied to the source electrode of P2 and since the gate electrode of P2 is connected to node B which is at, or close, to $V_{DD}$, the $V_{GS}$ of P2 is equal, or close, to zero volts and it remains cut-off. Also since N2 and D1 tend to hold node A close to ground potential, transistor N1 remains turned-off.

As $V_{DD}$ increases above $V_{TP}$ volts, a point is reached at which $V_{DD}$ exceeds $V_{TN}$ volts which is assumed, by way of example, to be equal to 1.5 volts. When $V_{DD}$ reaches $V_{TN}$ volts, transistor N3 begins to conduct with a current flowing from terminal 15 via the source-to-drain paths of P1 and N3 to ground. P2 remains turned-off since its $V_{GS}$ is less than its $V_{TP}$.

Figure 3:
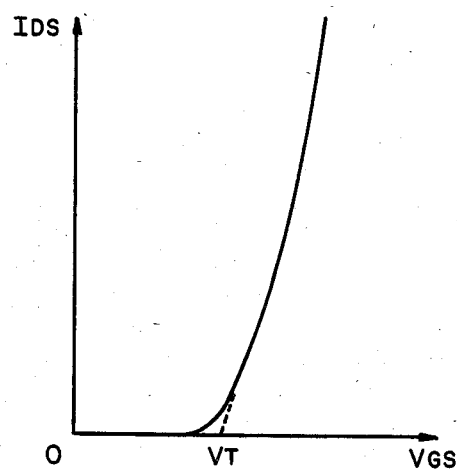
FIG. 3 is a drawing showing the characteristic of the gate-to-source voltage ($V_{GS}$) of an IGFET, whose gate and drain electrodes are connected in common, as a function of its drain-to-source current ($I_{DS}$).

As $V_{DD}$ increases above $V_{TN}$ volts, transistor N3, connected as an "MOS diode" between node B and ground, limits the voltage at node B such that it equals the $V_{GS}$ of N3. The "MOS diode" does not function as a perfect clamp due to its internal impedance, and its $V_{GS}$ increases with increasing $I_{DS}$ as shown in FIG. 3. However as is well known, $V_{GS}$ is equal to $V_T$ (when $I_{DS}$ is negligible) plus a constant times the square root of $I_{DS}$. Thus, a very large change in $I_{DS}$ must take place for $V_{GS}$ to increase appreciably. Consequently, it may be assumed that, while $V_{DD}$ increases by 1.25 volts above $V_{TN}$ (i.e., $V_{DD}$ goes from 1.5 volts to 2.75 volts), the $V_{GS}$ of N3 increases only by 0.25 volts as shown in FIG. 2 for the time $t_2$ through $t_3$. Thus when $V_{DD}$ rises to 2.75 volts the voltage at node B rises to 1.75 volts.

When $V_{DD}$ increases to and above 2.75 volts, the gate-to-source potential of P2 exceeds its $V_{TP}$. That is, the source of P2 is at 2.75 volts, or more, while its gate is at 1.75 volts. Hence, the $V_{GS}$ of P2 is equal to, at least, one volt which was assumed to equal its $V_{TP}$. P2 then begins to conduct and the potential ($V_A$) at node A begins to rise, as shown for $V_A$ in FIG. 2 beginning with time $t_3$.

As P2 conducts and $V_A$ rises the conduction of P1 decreases a little, decreasing $V_B$ which in turn causes P2 to conduct more. As shown in FIG. 2, when P2 begins to turn-on at time $t_3$, node A begins to rise relatively slowly until time $t_4$. The voltage at node A rises relatively slowly during the period $t_3$ to $t_4$ because $V_A$ is less than the $V_T$ of N1. However, as soon as $V_A$ rises above the $V_T$ of N1, N1 conducts and accelerates the discharge of node B, which turns P2 on harder. The harder P2 conducts the more P1 is turned-off and the more N1 is turned-on. From time $t_4$ to $t_5$, the full turn-on of P2 and the full turn-off of P1 occurs quickly since the regenerative feedback connection accelerates the turn-on of P2 and the turn-off of P1 until node A is at $V_{DD}$ volts and node B is grounded. Consequently, shortly after $V_{DD}$ rises above the sum of the threshold voltages of P2 and N3, P2 turns-on and node A is clamped to $V_{DD}$. $V_A$ then follows the $V_{DD}$ input voltage, as shown for $V_A$ beginning with time $t_5$ in FIG. 2.

The potential, Vo, at the output of inverter I4, is held at ground potential from the time $V_{DD}$ is zero volts, until $V_{DD}$ exceeds $V_{TP}$ as shown in FIG. 2. When $V_{DD}$ exceeds $V_{TP}$, P4 begins to conduct (it is assumed that all P-devices have the same value of $V_{TP}$) and couples $V_{DD}$ to its output. As long as $V_A$ is at ground potential, or less than the $V_T$ of N1, N4 is turned-off and P4 conducts coupling $V_{DD}$ to its output terminal. However, as soon as $V_A$ exceeds the $V_T$ of N1 and rises towards $V_{DD}$, N4 is turned-on and P4 is turned-off providing a negative going signal transition which activates, initializes, or enables the associated system.

A significant advantage of the circuit of the invention is that once P2 conducts, there is very little power dissipation in the circuit. The turn-on of P2 turns-off P1. Since P1 is turned-off, there is no conduction via its conduction path and "MOS diode" N3 to ground. The only conduction path is via diode D1 and transistor N2. However, N2 is a high impedance device and its dissipation is relatively low. N2 can be made to have a very high impedance since its only function is to ensure that the current path it provides from node A to terminal 19 exceeds the leakage current from terminal 15 to node A, which is primarily the very small leakage current drawn by turned-off transistor P2. Furthermore, it is possible to remove N2 from the circuit and rely on D1.

Thus, in the steady state condition it is possible with N2 removed from the circuit to have no dissipation, except for the leakage via D1 and the other transistors. As is well known leakage currents are very low and do not represent a significant problem.

It should be appreciated that the feedback of the output from P2 to the gate of P1 interrupts the flow of current through P1 preventing any further current flow through N3 and hence ensuring low power dissipation.

In the circuit of FIG. 1, once P2 turns-on and P1 turns-off, there is no power supplied to node B which either decays to ground (if N1 were not present) or is clamped to ground via N1. Once node B goes to ground, P2 will remain turned-on and P1 will remain turned-off until $V_{DD}$ decreases to, or close to, zero volts.

In the discussion above, it was assumed that $V_{TN}$ was of greater amplitude than $V_{TP}$. That need not be the case, $V_{TP}$ could be greater than $V_{TN}$.

What is claimed is:

1. The combination comprising:
   a first threshold circuit, having an input means and an output terminal, said first threshold circuit being responsive to an input voltage of greater amplitude than a first level for coupling to its output terminal an output voltage corresponding to said input voltage;
   means coupled to said output terminal of said first threshold circuit for limiting the voltage at said output terminal to a first value;
   a second threshold circuit, having an output terminal, said second threshold circuit being responsive to said input voltage being greater than said first value by a second value for producing at its output terminal an output voltage corresponding to said input voltage when the amplitude of said input voltage exceeds the sum of said first and second values; and
   feedback means coupled between the output of said second threshold circuit and said input means of said first threshold circuit for interrupting current flow through the output terminal of said first threshold circuit when said second threshold circuit produces an output voltage corresponding to said input voltage.

2. The combination as claimed in claim 1 wherein said means coupled to said output terminal of said first threshold circuit includes a transistor connected as a diode for limiting the voltage at said output terminal to a first value equal to the threshold voltage of said transistor.

3. The combination as claimed in claim 1 wherein said input voltage is applied between first and second power terminals, wherein said first threshold circuit includes a first insulated-gate field-effect transistor (IGFET) of first conductivity type having source and drain electrodes defining the ends of a conduction path and a control electrode, wherein the conduction path of said first IGFET is connected between said first power terminal and the output terminal of said first threshold circuit, and wherein its control electrode is connected via relatively high impedance means to said second power terminal.

4. The combination as claimed in claim 3 wherein said means coupled to said output terminal of said first threshold circuit includes a second IGFET of opposite conductivity type to that of said first IGFET, said second IGFET having source and drain electrodes defining the ends of a conduction path and a control electrode, wherein the control and drain electrodes of said second IGFET are connected to the output terminal of said first threshold circuit, and wherein the source electrode of said second IGFET is connected to said second power terminal.

5. The combination as claimed in claim 4 wherein said second threshold circuit includes a third IGFET of said first conductivity type having source and drain electrodes defining the ends of a conduction path and a control electrode, said third IGFET having its source electrode connected to said first power terminal, its control electrode connected to said output terminal of said first threshold circuit and having its drain electrode connected to its output terminal; and
   wherein said feedback means includes means connecting the drain electrode of said third IGFET to the control electrode of said first IGFET.

6. A threshold sensing circuit comprising:
   first and second terminals for the application therebetween of a potential whose level is to be sensed;
   first, second and third insulated-gate field-effect transistors (IGFETs), each IGFET having source and drain electrodes defining the ends of a conduction path and a gate electrode for controlling the conductivity of its conduction path; each one of said IGFETs requiring the application of a minimum gate-to-source potential defined as its threshold voltage ($V_T$) for conduction through the IGFET to occur;
   said first and second IGFETs being of one conductivity type and said third IGFET being of second conductivity type;
   means connecting the source electrodes of said first and second IGFETS to said first terminal;
   means connecting the drain electrode of said first IGFET to the gate electrode of said second IGFET and to the gate and drain electrodes of said third IGFET;
   means connecting the source electrode of said third IGFET to said second terminal;
   a relatively high impedance means connected between the gate electrode of said first IGFET and said second terminal for enabling the turn-on of said first IGFET when the operating potential between said first and second terminals exceeds the threshold voltage of said first IGFET; and feedback means connected between the drain electrode of said second IGFET and the gate electrode of said first IGFET for turning-off said first IGFET when said second IGFET is turned-on.

7. The combination as claimed in claim 6 wherein said relatively high impedance means includes a PN junction of relatively large capacitance and leakage connected between the gate electrode of said first IGFET and said second terminal.

8. The combination as claimed in claim 6 wherein said relatively high impedance means includes a low conductivity depletion type IGFET having its conduction path connected between the gate electrode of said first IGFET and said second terminal.

9. The combination as claimed in claim 6 further including a complementary inverter connected at its input to the drain electrode of said second IGFET.

10. The combination as claimed in claim 6 wherein the impedance of said relatively high impedance means connected between the gate electrode of said first IGFET and said second terminal is less than the impedance between the gate electrode of said second IGFET and said second terminal for values of said potential which are lower in amplitude than the threshold voltages of said first and said second IGFETs.

* * * * *